United States Patent [19]
Czubatyj et al.

[11] Patent Number: 5,180,690
[45] Date of Patent: Jan. 19, 1993

[54] METHOD OF FORMING A LAYER OF DOPED CRYSTALLINE SEMICONDUCTOR ALLOY MATERIAL

[75] Inventors: Wolodymyr Czubatyj, Warren; Stanford R. Ovshinsky, Bloomfield Hills; Guy C. Wicker, Southfield; David Beglau, Dearborn; Ronald Himmler, Sterling Heights; David Jablonski, Drayton Plains; Subhendu Guha, Troy, all of Mich.

[73] Assignee: Energy Conversion Devices, Inc., Troy, Mich.

[21] Appl. No.: 551,684

[22] Filed: Jul. 9, 1990

Related U.S. Application Data

[63] Continuation of Ser. No. 284,275, Dec. 14, 1988, abandoned.

[51] Int. Cl.⁵ .................. H01L 21/00; H01L 21/02; H01L 21/225; H01L 21/324
[52] U.S. Cl. .................. 437/233; 437/101; 437/108; 437/109; 437/165; 437/234; 437/967; 148/DIG. 1; 148/DIG. 122
[58] Field of Search ........... 437/101, 108, 109, 110, 437/165, 967, 233, 234; 148/DIG. 1, DIG. 122; 204/192.12, 192.25

[56] References Cited

U.S. PATENT DOCUMENTS

| | | | |
|---|---|---|---|
| 3,770,521 | 11/1973 | Demsky et al. | 437/165 |
| 3,998,675 | 12/1976 | Langheinrich et al. | 437/165 |
| 4,028,151 | 6/1977 | Lindmayer | 437/165 |
| 4,132,818 | 1/1979 | Chappelow et al. | 437/108 |
| 4,178,415 | 12/1979 | Ovshinsky et al. | 204/11 |
| 4,317,844 | 3/1982 | Carlson | 437/110 |
| 4,342,044 | 7/1982 | Ovshinsky et al. | 357/2 |
| 4,353,788 | 10/1982 | Jeffrey et al. | 204/192.25 |
| 4,358,326 | 11/1982 | Doo | 437/101 |
| 4,359,367 | 11/1982 | Zukotynski et al. | 437/101 |
| 4,382,099 | 5/1983 | Legge et al. | 437/165 |
| 4,417,092 | 11/1983 | Moustakas et al. | 204/192.25 |
| 4,465,529 | 8/1984 | Arima et al. | 437/165 |
| 4,529,617 | 7/1985 | Chenevas-Paule et al. | 437/101 |

FOREIGN PATENT DOCUMENTS

| | | | |
|---|---|---|---|
| 0049942 | 6/1978 | Japan | 437/165 |
| 0162224 | 12/1980 | Japan | 437/109 |
| 0107575 | 6/1984 | Japan | 437/101 |
| 2111534A | 7/1983 | United Kingdom | 204/192.25 |
| 2171844A | 9/1986 | United Kingdom | 437/109 |

OTHER PUBLICATIONS

Sze, S., VLSI Technology, Chapters 3 and 9, McGraw-Hill, 1983.
Brodsky, M., Doping of Sputtered Amorphous Semiconductors, IBM Tech. Discl. Bul., vol. 19, No. 12, May 1977, pp. 4802-4803.
Weissmantel, C., Ion Beam Sputtering and Its Applications for the Deposition of Semiconducting Films, Thin Solid Films, 13 (1972), pp. 359-366.
Philips, P., Doping of Solids from the Vapor Phase, IBM Tech. DIscl. Bul., vol. 14, No. 3, Aug. 1971, pp. 923-924.

Primary Examiner—Brian E. Hearn
Assistant Examiner—B. Everhart
Attorney, Agent, or Firm—Marvin S. Siskind

[57] ABSTRACT

A method for the low temperature fabrication of doped polycrystalline semiconductor alloy material. The method includes the steps of exposing a body of semiconductor alloy material to a reaction gas containing at least a source of the dopant element, and establishing an electrical potential sufficient to sputter etch the surface of said layer, while decomposing the reaction gas. This allows for the deposition of a layer of doped amorphous semiconductor alloy material upon the body of semiconductor alloy material. Thereafter, the doped layer of amorphous semiconductor alloy material is exposed to an annealing environment sufficient to at least partially crystallize said amorphous material, and activate the dopant element.

32 Claims, 2 Drawing Sheets

METHOD OF FORMING A LAYER OF DOPED CRYSTALLINE SEMICONDUCTOR ALLOY MATERIAL

This application is a continuation of application Ser. No. 284,275, filed on Dec. 14, 1988, now abandoned.

FIELD OF THE INVENTION

The present invention generally relates to a technique to form doped layers of polycrystalline semiconductor alloy material. The invention more particularly relates to a low temperature technique for fabricating doped layers of polycrystalline semiconductor alloy material. The polycrystalline semiconductor alloy material is useful in, for example, large area photosensitive devices and imaging electronics. The present invention has particular utility as a method of forming the doped regions employed as the source and drain regions of thin film transistors. (TFT's).

BACKGROUND OF THE INVENTION

Polycrystalline semiconductor alloy films have found great utility in the field of photosensitive devices, electronic imaging devices, and thin film transistors (TFT's). In particular, polycrystalline semiconductor alloy films have been investigated for use in TFT's for application as switching elements for large area, multipixel liquid crystal displays and image sensors.

Structurally, TFT's generally include source and drain electrodes, source and drain contact regions, a body of semiconductor alloy material between the source and drain electrodes, and a gate electrode in proximity to the body of semiconductor material, but insulated therefrom by a gate insulator. A typical enhancement mode thin film transistor is described in detail hereinbelow. Current in a TFT typically flows through the transistor, between the source and drain, and is controlled by the application of a voltage to the gate electrode. The voltage on the gate electrode produces an electric field which accumulates a charged region near the semiconductor body-gate insulator interface. This charged region forms a current conducting channel in the body of semiconductor material through which the device current is conducted.

In the fabrication of thin film transistors, source and drain regions should be rectifying if the body of semiconductor material is intrinsic, and ohmic if the body of semiconductor material is of opposite conductivity type than the source and drain. The resistivity of the source and drain contact regions should be as low as possible to reduce the loss of input signal. The source and drain contacts of TFT's are typically fabricated of thin metal layers deposited upon either p-doped or n-doped amorphous or polycrystalline semiconductor alloy films.

As used herein, the term "body of semiconductor alloy material" refers to a film of amorphous, polycrystalline or microcrystalline semiconductor material fabricated from silicon, silicon alloys, silicon:germanium alloys, germanium alloys, germanium, gallium arsenide, copper indium diselenide, carbon and combinations thereof. The term "doped layers of amorphous semiconductor alloy material" refers to doped layers of p-type or n-type amorphous material fabricated from silicon, silicon alloys, silicon:germanium alloys, germanium alloys, germanium, gallium arsenide, copper indium diselenide, carbon and combinations thereof. It is to be understood that silicon:germanium alloys include all combinations and ratios of silicon and germanium.

Many different deposition techniques have been employed in order to fabricate doped layers of amorphous semiconductor alloy material for use in, for example, the source and drain regions of thin film transistors. One such technique involves depositing a body of semiconductor alloy material upon a substrate, as by conventional deposition processes, and which deposited material is then subjected to an ion implantation technique to dope at least a portion of the body of semiconductor alloy material so as to define source and drain regions. However, ion implantation has several inherent disadvantages which make its use for fabrication of doped layers of semiconductor alloy material impractical, particularly for large-scale, commercial applicators, such as the commercial fabrication of, e.g., displays, and photosensitive devices employing such TFT devices. These inherent disadvantages include: (1) the radius of the ion beam used to implant a desired dopant is generally quite small, thus requiring that the ion beam be repeatedly scanned in order to attain complete coverage over a wide area sample; (2) ion implantation devices are generally very difficult to scale up to large area, continuous throughput production processes such as is required in the commercialization of a product employing TFT's; (3) said ion implantation devices typically require large magnetic fields as well as high vacuum, low pressure regimes for operation; these parameters significantly increase both the initial purchase cost of such devices, as well as the cost of operating such devices; and (4) ion implantation, due to high energy impact of the implanted ions, causes significant physical damage to the body of semiconductor alloy material, thus necessitating a subsequent annealing process to repair the damage. This anneal/repair process may be too physically stressful for some types of low temperature substrates, such as low temperature glasses.

A second technique which has been employed for the fabrication of doped layers of amorphous semiconductor alloy material is the use of conventional deposition processes, such as sputtering, or r.f. glow discharge plasma deposition, to form a multilayered amorphous structure. The multilayered amorphous structure may subsequently be at least partially crystallized, as by conventional techniques such as thermal anneal, to form polycrystalline or microcrystalline layers. By this method, substantially intrinsic amorphous silicon alloy material is deposited by, for example, r.f. glow discharge from silane with an added compensating element or elements such as hydrogen, fluorine or both. Deposited upon the semiconductor alloy material is a second layer of amorphous semiconductor alloy material, which second layer is doped so as to possess either p or n-type conductivity. Doping of the second layer is achieved by the addition of a precursor dopant gas to the deposition gases present in the r.f. glow discharge deposition chamber. After depositing such layers, unwanted areas of said doped material may be removed, as by conventional photolithographic techniques to form desired device features.

While this technique has the advantage of being relatively easy in terms of actual deposition, devices formed in this way are inherently inferior to those produced by, for example, costlier ion implantation techniques. Multilayered devices fabricated by conventional plasma deposition techniques potentially demonstrate significant peeling problems between the stacked layers as well as other interfacial defects. The interface between said layers, e.g., between the semiconductor body and the source or drain regions, gives rise to a significant density of defect states, which states significantly decrease the performance of the device. A gradual gradation from intrinsic to n-type to heavily n-type would greatly reduce the density of defect states, and therefore improve device performance.

A third technique which may be employed to form doped layers of amorphous semiconductor alloy material is an "ion shower" technique such as that discussed by Yoshida, et al in "Formation of Source and Drain Regions for Amorphous Si:H Thin-Film Transistors by Low Energy Ion Doping Techniques" published in IEEE Electron Device Letters, Vol. 9, No. 2, Feb. 1988. While this technique possess several advantages over conventional ion implantation, notably the ability to act over a larger area than regular ion implantation, it still possesses several disadvantages, particularly the need for magnetic fields. Further, Yoshida, et al require a high vacuum, low pressure regime in order to accelerate dopant ions sufficiently to implant them into the host material.

One shortcoming inherent in each of the aforementioned techniques is the high annealing temperatures required to activate the dopant ions within the body of semiconductor alloy material to provide electrical activity. Activation of the doped layer of amorphous semiconductor alloy material includes exposing said materials to a temperature regime sufficient to at least partially crystallize the amorphous materials, i.e., form a poly or microcrystalline structure, while incorporating the dopant element into the matrix of the semiconductor alloy material. This is critical since techniques requiring high activation temperatures necessitate the use of expensive, high temperature resistant glass substrates such as Hoya NA40 display glass. Such high temperature substrates greatly increase the cost associated with fabricating electronic devices such as imaging arrays.

It thus becomes apparent that a need exists for a deposition method which allows for easy, economical fabrication of doped polycrystalline semiconductor alloy material, at relatively low temperatures.

THE BRIEF DESCRIPTION OF THE INVENTION

Disclosed herein is a low temperature method of forming doped polycrystalline semiconductor alloy material. The semiconductor alloy materials used herein include, but are not limited to silicon, silicon alloys, silicon:germanium, germanium alloys, germanium, gallium arsenide, copper indium diselenide, carbon and combinations thereof. The method comprises the steps of providing an evacuable enclosure which can be maintained at sub-atmosphere pressures, and which includes therein a first electrode and a second substrate electrode. A body of semiconductor alloy material deposited upon, for example, a low temperature glass substrate, is operatively disposed upon the substrate electrode. A semiconductor alloy containing target may be disposed in electrical contact with said first electrode, said target being either compositionally the same as, or compositionally different than the body of semiconductor alloy material deposited upon the substrate. It is important to not that the use of a target in electrical contact with the first electrode is not necessary for purposes of effecting the method of the instant invention.

Thereafter, a reaction gas is introduced into the interior of said evacuable enclosure. The reaction gas includes a diluent gas and a precursor dopant gas. An electrical potential is established between the first electrode and the second, substrate electrode, said potential being sufficient to decompose the precursor dopant gas and sputter etch at least a portion of said body of semiconductor alloy material. At least the decomposed precursor dopant gas and the sputter etched portion of the body of semiconductor alloy material combine and redeposit upon the exposed surface of the semiconductor alloy material coated substrate. The method of the instant invention includes the further step of subsequently subjecting the doped layer of amorphous semiconductor alloy material, disposed upon the body of semiconductor alloy material to an energy source sufficient to at least partially crystallize said doped layer. The energy may further be sufficient to also at least partially crystallize the body of semiconductor alloy material.

In one embodiment of the method disclosed herein, the evacuable enclosure is maintained at a sub-atmospheric pressure of between 30 millitorr and 1 torr and preferably between 100 and 200 millitorr. Within said enclosure the first and second electrodes are operatively disposed from one another a distance of 5 and 25 centimeters and preferably about 12 centimeters distant. As mentioned hereinabove, a reaction gas is introduced into the interior of said reaction vessel, said reaction gas including a diluent gas selected from the group consisting of hydrogen, argon, helium, and combinations thereof. The precursor dopant gas typically consists of a dopant element which is to be incorporated into the body of the semiconductor alloy material. Typical dopant elements include phosphorous, boron, arsenic, aluminum, and combinations thereof. Typical precursor dopant gases include but are not limited to $PH_3$, $PF_5$, $B_2H_6$, $BF_3$, $AsH_3$, and combinations thereof. In one preferred embodiment, the reaction gas comprises hydrogen as the diluent gas, $PH_3$ as the precursor dopant gas and wherein said reaction gas contains approximately 98% hydrogen and 2% $PH_3$. It is to be understood other diluent to dopant gas ratios may be employed with equal success.

As mentioned hereinabove, a potential is established between said first and second electrodes, said potential typically being between 0.5 kilovolts and 9.0 kilovolts dc and preferably between about 4.0 kilovolts and 7.0 kilovolts dc. This potential is established by maintaining said substrate electrode at substantially ground potential while applying the desired voltage to the target electrode. By employing the method disclosed herein, it is possible to fabricate doped layer of amorphous semiconductor alloy material, said doped layer being between 5 and 400 Angstroms thick, and wherein the concentration of the dopant therein may be varied by both continuous variation of deposition parameters and diffusion during subsequent activation.

In order to activate the doped layer of amorphous semiconductor alloy material fabricated by the method disclosed herein, it is necessary to expose said doped material to an activation energy sufficient to at least partially crystallize the doped layer of amorphous semiconductor alloy material, while incorporating the dopant element thereinto. Activation energy is typically provided by an energy source such as for example, laser energy, thermal heating and combinations thereof. Said energy source may be for example, a pulsed excimer laser adapted to anneal at least said doped layer of semiconductor alloy material at high temperatures for a brief amount of time such as, for example, 10 to 500 nanoseconds. Alternatively, the energy source may be a thermal annealing heater or oven adapted to anneal at least said doped layer of semiconductor alloy material at lower temperatures such as for example, 400° to 700° Centigrade over a lengthier period of time such as for example between 6 and 160 hours.

DETAILED DESCRIPTION OF THE INVENTION

Figure 1:
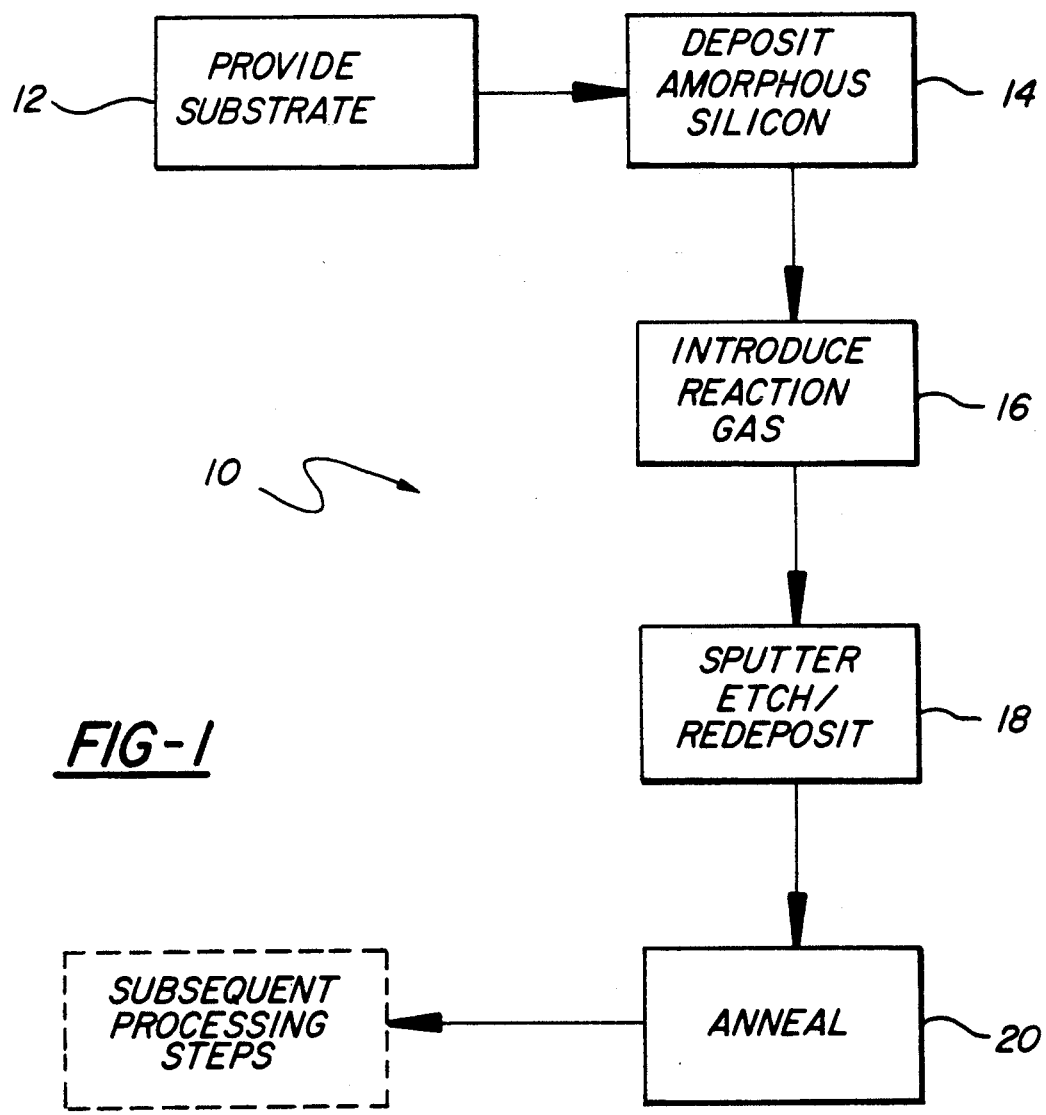
FIG. 1 is a block diagram illustrating the progression of steps necessary to effect the method disclosed in the instant patent application.

Referring now to FIG. 1, there is illustrated therein a block diagram depicting the particular sequence of steps necessary to effect the method of the instant invention. The first step illustrated in diagram 10, and described in block 12 is that of providing a suitable substrate for purposes of fabricating a desired electronic device. As discussed herein, it is an advantage of the instant method that doped layers of polycrystalline semiconductor alloy material can be fabricated at relatively low temperature, i.e. 500°-600° Centigrade melting point, glass substrates, as opposed to high melting point glass required by prior art methods. As a result, inexpensive, high quality, low temperature glass, such as Corning 7059 glass can be employed in conjunction with the instant method, thereby significantly reducing manufacturing costs of, for example, large area liquid crystal displays. Alternatively, other types of substrate material may be employed, such as but not limited to polymeric substrate materials, metallic substrate materials and degenerate semiconductor materials.

Block 14 of FIG. 1 specifies the second step of the method disclosed herein. The second step involves the deposition of the body of semiconductor alloy material onto the exposed surface of said substrate, e.g., the low temperature glass substrate. This step may be accomplished by any conventional deposition process, such as, low pressure chemical vapor deposition, or r.f. glow discharge deposition of, for example, amorphous silicon from a silicon containing precursor gas. This step also includes any additional steps which may be required for the preparation of a particular electronic device, examples of which include but are not limited to: 1) selectively etching away portions of said body of semiconductor alloy material to establish a preferred device geography; 2) depositing a mask to prevent the subsequent deposition of a doped layer of amorphous semiconductor alloy material thereover; and 3) selective deposition of a second or subsequent layer of material as required for a specific device.

Block 16 of FIG. 1 shows the step of exposing the body of semiconductor alloy material coated substrate to a source of reaction gas. This exposure occurs within the confines of an evacuable chamber, into which said semiconductor alloy coated substrate is disposed. The evacuable chamber includes a first and second electrode. The semiconductor alloy coated substrate is disposed in electrical contact with said second electrode. Spacedly disposed therefrom, though still within said enclosure is the first electrode, which may have, in electrical contact therewith, a semiconductor alloy material containing target. The semiconductor alloy target is typically fabricated of the same semiconductor alloy material deposited upon the substrate, though it may in certain circumstance be compositionally different. Alternatively, no target need be disposed in contact with the first electrode.

Introduced into the interior of said enclosure is said reaction gas, which includes: 1) a diluent gas, typically selected from the group consisting of hydrogen, argon, helium, and combinations thereof; and 2) a precursor dopant gas, including a dopant element such as boron, phosphorous, aluminum, arsenic and combinations thereof. Preferred dopant gasses include $PH_3$, $PF_5$, $B_2H_6$, $BF_3$, $AsH_3$ and combinations thereof. In an embodiment adapted to deposit a layer of n-doped material, the reaction gas comprises, for example, 98% hydrogen as the diluent gas, and 2% $PH_3$, (phosphine), as the precursor dopant gas.

The next step, block 18 of FIG. 1, shows that a potential is then established between the first electrode and the second, substrate electrode, which potential is sufficient to: (1) decompose the precursor dopant gas; (2) sputter material from the target, if one is present; and (3) sputter etch the exposed surface of the body of semiconductor alloy material. The potential required to achieve the desired results is between 0.5 and 9.0 KV DC, and preferably between 4.0 and 7.0 KV. The potential is established by maintaining the second, substrate electrode at substantially ground potential, while applying the desired voltage to the first electrode. As the surface of the body of semiconductor alloy material is sputter etched, the target, if one is present, is sputtered, and the precursor dopant gas is decomposed. Sputtered semiconductor alloy material is combined with ions liberated by the decomposition of the precursor dopant gas, (for example $P^+$ ions from decomposed phosphine) to redeposit a layer of phosphorus doped amorphous semiconductor alloy material upon the exposed surface of the body of semiconductor alloy material. This deposited layer may also include components sputtered from the target. This doped layer may contain a graded concentration of dopant material, wherein the greatest concentration of dopant is found at or near the surface of the doped layer, and the lowest concentration of dopant is found at the interface between the doped layer and the body of semiconductor alloy material. The resulting structure is multilayered and the deposited material may vary from, for example, substantially intrinsic, to slightly n-doped, to n-doped to heavily n-doped. It is noteworthy that comparable deposition of doped layers of semiconductor alloy material may be deposited, even in the absence of the target.

A dopant grading continuum is important for the annealing, activation step shown in block 20 in FIG. 1. Annealing "activates" i.e., partially crystallizes at least the doped layer of amorphous semiconductor alloy material, while incorporating the dopant element into the matrix of the semiconductor alloy material. The dopant grading continuum is thus critical since annealing causes crystallites possessing the graded profile found in the amorphous material to grow. Polycrystalline material having the graded profile will therefore not possess the abrupt interfaces of prior art devices, and therefore have superior electronic qualities. This will allow for the economical fabrication of a wide variety of high quality electronic devices, such as TFT's.

It is noteworthy to remember that the instant method, while achieving the same results as ion implantation, is not an ion implantation process, and therefore provides several inherent advantages over ion implantation. These advantages include: (1) relatively low apparatus costs since the instant method does not require the magnetic fields and high vacuum/low pressure regime found in ion implantation devices; (2) the easy scale up of the instant method to commercial size applications; (3) relatively large areas upon which the instant method can be employed; and (4) no high energy ion collisions which may damage the semiconductor alloy material.

The method of the instant invention allows for the fabrication of polycrystalline thin film transistors at low temperature on low melting point glass substrates such as, for example, Corning 7059 Glass. All the processing steps used to fabricate the doped polycrystalline semiconductor alloy device where carried out at temperatures of 550° C. or less, thus allowing the use of an inexpensive glass such as the Corning 7059 Glass. Alternatively, in situations wherein higher temperature glass substrates are used, the annealing, activation temperature may be for example, 600° C. or more and be annealed for 6 hours or less. It is also possible to use a pulsed excimer laser device to anneal the sample at temperatures of approximately 900° C. for about 100 nanosecond time periods. As the sample described herein uses relatively low temperature Coring 7059 Glass, it is necessary to anneal for approximately 75 hours at 550° C.

Block 22 of FIG. 1, in phantom, is presented to show that additional, subsequent processing steps may be performed upon the activated, doped layer of polycrystalline semiconductor alloy material. A processing step often performed upon, doped layer of polycrystalline semiconductor alloy material is an etch step adapted to form a surface feature unique to a given electronic device. An etch step may be effected by an conventional plasma or wet etch technique known in the art. Particularly preferred plasma etchants include the fluorine based etchants such as $CF_4$, $NF_3$ and $SF_6$; preferred wet etchants are typically of the hydrofluoric/nitric acid type wet etchants, particularly those including phosphorus containing compounds such as phosphoric acid. Other operations which may be performed upon the activated, doped layer of polycrystalline semiconductor alloy material include, but are not limited to masking, deposition of a second or subsequent layer and annealing.

Figure 2:
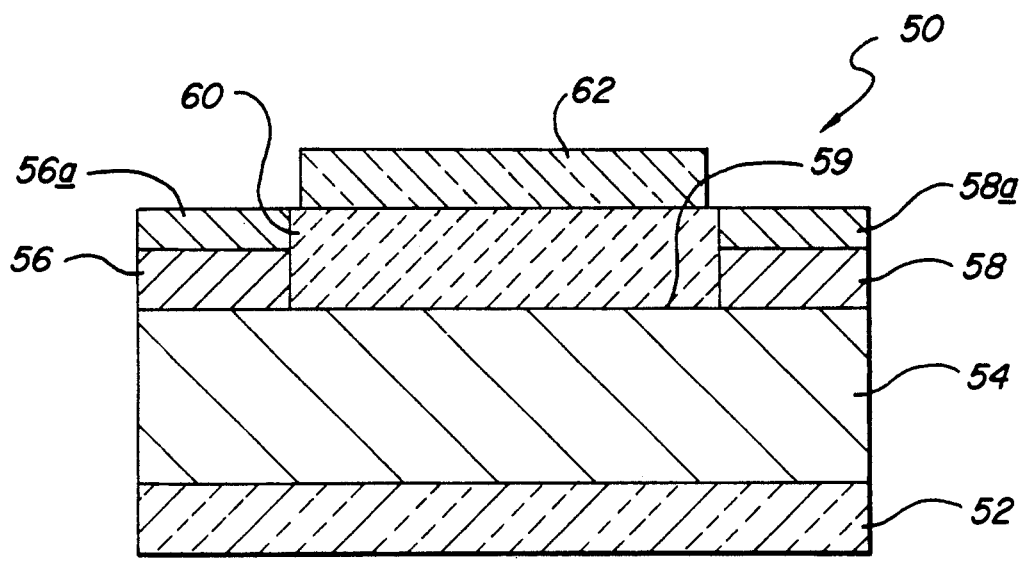
FIG. 2 is a cross-sectional side view of a thin film field effect transistor fabricated by the method of the present invention.

The method of the instant invention is useful for the fabrication of all doped layers of semiconductor alloy material, regardless of the device into which it is incorporated. Examples of devices which may be fabricated by the instant method include but are not limited to; p-i-n type photovoltaic cells, thin film diodes, p.n. junction devices and thin film transistors. Turning now to FIG. 2, there is illustrated therein a cross-sectional side view of a polycrystalline semiconductor alloy material, thin film field effect transistor fabricated by the method of the present invention. It is to be noted that the TFT illustrated in FIG. 2 is an example of but one type of electronic device which may be fabricated by the novel method of the instant invention. The TFT of FIG. 2 is presented only for purposes of illustration, and should not be considered a limitation on the instant invention. The thin film field effect transistor 50 includes a substrate 52 which may be formed of an insulating material such as, for example, glass or a polymer. In one embodiment, the substrate 52 is glass, and preferably a low temperature, low melting point, high quality display glass, such as Corning 7059 Glass.

The thin film transistor further includes a body of semiconductor alloy material 54. The body of semiconductor alloy material 54 can be formed by a deposition technique of a type well known to one skilled in the art of thin film deposition, for example, glow discharge deposition, low pressure chemical vapor deposition (LPCVD) or molecular beam epitaxy. The semiconductor alloy material which comprises the semiconductor body 54 should be deposited to a depth of at least about 5,000 angstroms. The thin film transistor 50 further includes a source 56 and a drain 58. In accordance with a preferred embodiment of the thin film transistor, the source and drain 56 and 58 respectively, take the form of deposits of doped semiconductor alloy material. The body of semiconductor alloy material 54, comprises a body of substantially intrinsic amorphous silicon alloy material containing a compensating agent such as hydrogen and/or fluorine. The doped semiconductor alloy material forming the source and drain 56 and 58 is fabricated by the novel process of the instant invention, and is preferably semiconductor alloy material, doped with an n-type dopant such as, for example, phosphorous. The source and drain 56 and 58 will form ohmic contacts with the body of semiconductor material 54.

Alternatively, if the body of semiconductor alloy material 54 is slightly n-type, the source 56 and drain 58 can be formed of p-type amorphous semiconductor alloy material so as to provide a rectifying contact to reduce the reverse leakage current conducted through the device, e.g., at high frequency operation. In such a case, a p-type dopant such as boron is used as the dopant. After completing the deposition process of the instant invention, a layer of doped amorphous silicon alloy material is obtained. All that remains is to anneal the amorphous semiconductor body 54 and the source and drain 56, 58 in order to partially crystallize, the amorphous material. This annealing step, which is described in greater detail hereinbelow, accomplishes three critical functions, it: (1) diffuses and activates the phosphorus dopant into the matrix of the semiconductor alloy material of the source and drain contact; (2) crystallizes the doped layer of amorphous silicon alloy material into a layer of doped polycrystalline silicon alloy material; and (3) densifies the Corning 7059 glass substrates.

Thereafter a layer of metal such as, for example, chromium, aluminum, molybdenum and combinations thereof, is deposited atop the source 56 and drain 58 regions so as to form a source and drain contact layer. The layer of metal is then patterned to form source and drain contacts 56a and 58a, directly atop said source drain. The metal layer is also adapted to mask the source and drain during a subsequent etch step which removes excess doped semiconductor alloy material from the surface of the body of semiconductor alloy material 54 thereby creating a TFT channel 59. Etching may be affected by any conventional etching technique, such as plasma etching or wet etching. Preferred plasma etchants include fluorine based etchants such as $CF_4$, NF₃ and SF₄; preferred wet etchants include HF/HNO₃ etchants including phosphorus containing compounds such as phosphoric acid.

After etching the n-type material, so as to create TFT channel 59, it is necessary to deposit atop the body of semiconductor alloy material 54, and in the TFT channel, a gate insulator 60. The gate insulator 60 can be formed from an insulating material, such as silicon oxide or silicon nitride. The thin film transistor of FIG. 2 employs a silicon nitride layer as the gate insulator 60, which is deposited by plasma decomposition of silane and NH₃ at 200° C. Alternatively, when the gate insulator 60 is formed from silicon oxide it can be deposited by, for example, the glow discharge decomposition of silane and oxygen.

The device 50 is completed with the formation of the gate electrode 62 over the gate insulator 60. The gate electrode 62 can be formed from any conductive material or metal such as, for example aluminum or chromium. In a preferred exemplification, aluminum is employed as the conductive material, and is deposited and patterned to make the gate electrode directly atop the TFT channel 59 and gate insulator 60. Vias are then etched as by standard etching techniques, so as to provide access to the source and drain 56 and 58 and source and drain contacts 56a and 58a respectively.

With respect to the embodiment of FIG. 2, the body of semiconductor alloy material 54 is preferably deposited to a thickness of about 1,000 angstroms to 1 micron. The source 56 and drain 58 are preferably formed to have thicknesses on the order of 100 to 500 angstroms and formed as a p-type or an n-type region. The gate insulator 60 is preferably formed to have a thickness ranging between 300 and 5,000 Angstroms.

Figure 3:
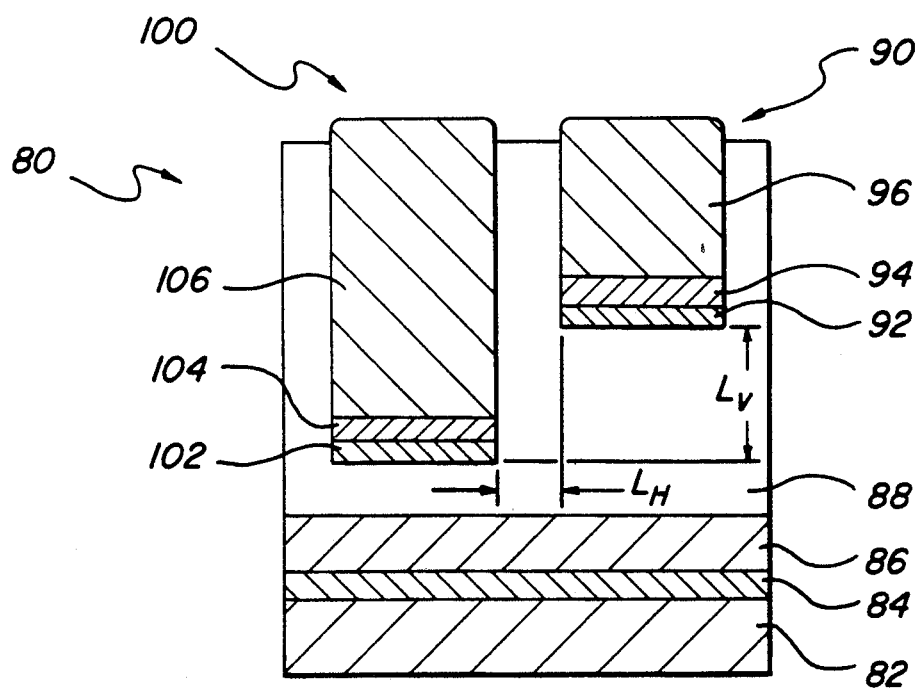
FIG. 3 is a cross-sectional side view of a "J" channel MISFET fabricated by the method of the present invention.

Referring now to FIG. 3, there is illustrated therein a cross-sectional side view of a "J" channel metal-insulator-semiconductor field effect transistor (MISFET) 80, fabricated by the method of the instant invention. The "J" channel MISFET 80 includes a horizontal substrate 82, a gate electrode 84 deposited on the horizontal substrate 82 and a gate insulator 86 deposited thereon. The substrate 82, in one preferred embodiment is a low temperature, low melting point, high quality display glass, such as Corning 7059 glass. Further, while the substrate 82 is characterized and referred to herein as a horizontal substrate, such characterization and reference is only with respect to the individual device, and not with respect to an integrated circuit or the terrestial horizon. The horizontal substrate 82 with the gate electrode 84, and gate insulator 86 further includes a body of semiconductor alloy material 88 stacked thereon, which stacked structure defines a metal insulator semiconductor structure. It is to be noted that the MISFET illustrated in FIG. 3 is but one example of an electronic device which can be fabricated by the instant method. It is presented only for purposes of illustration, and is not to be considered a limitation on the instant invention.

Within the body of semiconductor alloy material 88 are the drain electrode 90 and source electrode 100. The drain electrode 90 includes a region of highly doped semiconductor alloy material, for example n+ doped semiconductor 92, a metal electrode 94 and a lead, for example, an aluminum lead 96. The source electrode 100 includes a region of highly doped semiconductor alloy material 102, for example an n+ plus region, a metal layer 104 and a lead, for example, an aluminum lead 106. The metal used in the metal electrode is typically selected from the group consisting of aluminum, molybdenum, chromium and combinations thereof.

In accordance with a preferred embodiment of the instant invention, the heavily doped regions 92 and 102 respectively are formed by the novel deposition method disclosed herein. Specifically, the body of semiconductor alloy material 88, deposited upon the substrate 82, the gate electrode 84 and the gate insulator 86, is patterned so as to define two plateaus, upon which said source and drain are formed. The patterned body of semiconductor alloy material is operatively disposed into the evacuable chamber, in contact with the substrate electrode. Reaction gas is introduced thereinto and a potential is established between said electrodes. This potential causes at least a portion of the exposed surface of the body of semiconductor alloy material to be sputter/etched therefrom. This sputter/etched material is combined with at least decomposed dopant species from the reaction gas to form a layer of doped amorphous semiconductor alloy material upon the two plateaus of the body of semiconductor alloy material. This doped layer is then masked and etched by conventional techniques so as to form the heavily doped regions 92, 102 of the "J" channel MISFET.

The source electrode 100 and drain electrode 90 are horizontally and vertically displaced from each other so as to define a generally "J" shaped conduction channel therebetween and within the semiconductor region 88. The vertical separation $L_v$ is sufficient to substantially reduce and even eliminate "off" current (leakage current), e.g., about 5000 Angstroms to about 10,000 Angstroms. For analog applications the vertical separation is sufficient to provide high voltage application.

The source and drain electrodes 100-90 are horizontally separated from each other by an amount, $L_H$, sufficient to substantially avoid overlapping of the edges, and leakage current, and by an amount to substantially avoid Miller Capacitance. This is generally from about 200 Angstroms to 3000 Angstroms. In one preferred exemplification the source electrode 100 is close enough to the gate insulator 86 to allow an effect analogous to punch through in bipolar junction transistors. By punch through is meant breakdown which can occur in a normal electrode spacing at high voltage when the enhancement layer extends completely from source to the area directly underneath the source via the conductive channel.

The "J" channel MISFET has only one type of current carriers, i.e. only electrons or only holes. Electron conduction is preferred because of the higher mobility of electrons. The "J" channel MISFET fabricated by the method of the instant invention modulates the current in the current conduction channel by means of a gate electric field. The electric field extends through the gate insulator 86, which is typically a layer of insulating material, such as silicon dioxide, silicon nitride, tantalum oxide, aluminum oxide, or the like, into the body of semiconductor alloy material 88. A layer of gate insulator material is typically between 1000 Angstroms and 5000 Angstroms thick, and is adapted to separate the current channel from the gate electrode 84. The region of the body of semiconductor alloy material between the source and drain electrode regions 90, 100 is the current channel. A layer of metal, for example aluminum is deposited upon the substrate 82 as the gate electrode 84.

EXAMPLES

Several doped polycrystalline silicon devices were prepared by the low temperature process in the instant invention. The method was successfully employed for the fabrication of the highly doped n+ type source and drain regions in thin film transistor devices (TFT's).

EXAMPLE I

The polycrystalline silicon thin film devices where prepared by depositing an amorphous silicon alloy film onto low temperature Corning 7059 Glass substrates in a hot wall, low pressure chemical vapor deposition reactor maintained at approximately 2 torr, and 550° C. The amorphous silicon alloy film was deposited using silane ($SiH_4$) as the deposition gas. The silicon film so deposited was determined to be amorphous by Raman spectroscopy and x-ray diffraction analysis. The deposited film was then subjected to the novel fabrication process of the instant invention. Specifically, the amorphous silicon alloy coated substrate was placed in an evacuable enclosure which enclosure was maintained at a pressure of 100 millitorr. The evacuable enclosure included a first electrode and a spacedly disposed second, substrate electrode upon which was disposed the amorphous silicon coated substrate. The first electrode and the second substrate electrode were spacedly disposed from one another a distance of about 12 centimeters. A silicon containing target was operatively disposed in contact with the first electrode.

Introduced into the interior of said evacuable chamber was the reaction gas. The reaction gas contains at least a precursor dopant gas and a diluent gas. The reaction gas employed herein comprised 98% hydrogen as the diluent gas, and 2% phosphine ($PH_3$) as the precursor dopant gas. Thereafter, an electrical potential was developed and maintained between said first and second electrodes. This potential was created by holding the second, substrate electrode at substantially ground potential while applying 4.0 KV to the first electrode and passing 1 milliampere of current therethrough for 1 minute. The evacuable chamber was maintained at room temperature as the reaction gas was introduced thereinto.

The process described hereinabove yielded an amorphous silicon coated substrate having an upper layer of heavily phosphorous doped amorphous silicon alloy material. Specifically, Auger electron spectroscopy showed that the phosphorous, n-dopant, was deposited to a depth of approximately 200 angstroms, and further that the concentration of phosphorous was graded from about 50% at the surface of the sample to about 2% at a depth of 200 Angstroms. Experimentation has shown that longer run times, i.e., run times greater than about 60 seconds do not appreciably effect either quality or quantity of doped, deposited semiconductor alloy material.

Thereafter, it was necessary to anneal the sample substrate. Specifically, the samples were annealed for a period of time between 75 and 96 hours at temperatures ranging from 520° to 550° C. This annealing is necessary to activate the doped amorphous silicon alloy material so as to at least partially crystallize said material to a polycrystalline silicon material, while incorporating the phosphorous dopant into the material.

Thereafter, the samples were removed and subjected to such processes as are consistent with the fabrication of a thin film transistor device such as those illustrated in FIG. 2 hereof. The device of FIG. 2, including the doped polycrystalline silicon alloy material fabricated by the process disclosed herein display field effect mobilities in the range of 8 to 15 $Cm^2$/V-Second. The threshold voltage for these devices ranged between approximately 6 volts and 0 volts. It is believed that high mobility devices such as the polycrystalline silicon TFT's fabricated by the instant process can be successfully employed in integrated row and column driving electronics for liquid crystal display devices, particularly those deposited upon low temperature glass such as the Corning 7059 glass.

EXAMPLE II

A second group of polycrystalline silicon thin film devices where prepared by substantially the same process as that described hereinabove with reference to Example I. The only difference in the fabrication process was that the target of semiconductor alloy material disposed in electrical contact with the first, target electrode, was removed in the second example. Said target was not replaced, therefore only the first electrode, fabricated of stainless steel, and the substrate coated with a body of amorphous silicon alloy material were disposed within the evacuable chamber. Every other step and critical parameter was kept exactly as described in Example I.

Samples prepared in this manner were found to be virtually identical to those produced in the first Example. Specifically, Auger electron spectroscopy showed phosphorus to be present to a depth of approximately 200 Angstroms in the deposited amorphous material. The concentration of phosphorus was graded from about 50% at the surface of the deposited material to about 2% at a depth of 200 Angstroms into the sample. Devices fabricated from this deposited sample demonstrated operating characteristics identical to those from Example I.

The foregoing Examples and Description are merely meant to be illustrative of the utility of the method of the instant invention and are not intended as limitations thereupon. It is therefore the Claims which follow including all equivalents which are intended to find the scope of the instant invention.

What is claimed is:

1. A method for the low temperature fabrication of doped polycrystalline semiconductor alloy material comprising the steps of:

providing an evacuable enclosure, said enclosure including a first electrode and a second, spacedly disposed substrate electrode;

providing a substrate having a body of amorphous semiconductor alloy material thereupon, and disposing said substrate upon said substrate electrode;

evacuating said enclosure to sub-atmospheric pressure;

introducing a reaction gas into the interior of said enclosure, said reaction gas comprising a diluent gas and a precursor dopant gas;

establishing an electrical potential between said first and said second electrodes, said electrical potential being sufficient to decompose said precursor dopant gas and sputter-etch at least a portion of said amorphous semiconductor alloy material from said substrate;

depositing a layer of doped amorphous semiconductor alloy material from said decomposed dopant gas and sputter-etched semiconductor alloy material upon said body of amorphous semiconductor alloy material without providing an external gaseous source of semiconductor material; and subjecting said doped amorphous semiconductor alloy material coated body of amorphous semiconductor alloy material to an activation energy sufficient to at least partially crystallize the doped layer thereof and incorporate the dopant element into the matrix of the crystallized layer.

2. A method as in claim 1, including the further step of providing a sputtering target in electrical contact with said first electrode.

3. A method as in claim 2, wherein the composition of the sputtering target is substantially the same as the composition of the body of semiconductor alloy material.

4. A method as in claim 2, wherein the composition of the sputtering target is different than the composition of the body of semiconductor alloy material.

5. A method as in claim 1, wherein said enclosure is maintained at a pressure of between 30 and 500 millitorr.

6. A method as in claim 5, wherein said enclosure is maintained at a pressure of between 100 and 200 millitorr.

7. A method as in claim 2, wherein said first electrode and said second substrate electrode are operatively disposed between 5 and 25 centimeters apart.

8. A method as in claim 7, wherein said first electrode and said second, substrate electrode are operatively disposed 12 centimeter apart.

9. A method as in claim 1, wherein said precursor dopant gas contains a dopant selected from the group consisting of phosphorous, boron, arsenic, aluminum and combinations thereof.

10. A method as in claim 9, wherein said dopant gas is selected from the group consisting of $PH_3$, $PF_3$, $B_2H_6$, $BF_3$, $AsH_3$, and combinations thereof.

11. A method as in claim 10, wherein said diluent gas is selected from the group consisting of hydrogen, argon, helium, and combinations thereof.

12. A method as in claim 11, wherein said diluent gas is hydrogen.

13. A method as in claim 1, wherein said body of semiconductor alloy material is selected from the group consisting of silicon, silicon alloys, silicon:germanium, germanium alloys, gallium arsenide, copper indium diselenide, carbon and combinations thereof.

14. A method as in claim 1, wherein said electrical potential is between 0.5 and 9.0 KV dc.

15. A method as in claim 11, wherein said electrical potential is between 4.0 and 7.0 KV dc.

16. A method as in claim 1, wherein said substrate electrode is maintained at substantially ground potential.

17. A method as in claim 1, wherein the doped layer of amorphous semiconductor alloy material is deposited upon said body of semiconductor alloy material to a depth of between 5 angstroms and 400 angstroms.

18. A method as in claim 1, including the further step of controlling the amount of dopant present in said doped amorphous semiconductor alloy material.

19. A method as in claim 18, including the further step of controllably varying the concentration of precursor dopant gas in the reaction gas.

20. A method as in claim 19, wherein the concentration of dopant in said deposited material is greatest at the top of said layer and decreases with increasing depth.

21. A method as in claim 1, including the further step of etching said layer of doped polycrystalline semiconductor alloy material.

22. A method as in claim 21, wherein said etchant is selected from the group consisting of hydrofluoric acid, nitric acid, phosphoric acid, and combinations thereof.

23. A method as in claim 1, wherein said activation energy is provided by an energy source selected from the group consisting of lasers, thermal heating and combinations thereof.

24. A method as in claim 23, wherein said energy source is a pulsed excimer laser adapted to anneal said doped layer of amorphous semiconductor alloy material at high temperatures for a brief amount of time.

25. A method as in claim 24, wherein said laser heats said doped layer of amorphous semiconductor alloy material to 900° Centigrade for 50-500 nanoseconds.

26. A method as in claim 23, wherein said energy source is a thermal annealing heater adapted to anneal said doped amorphous silicon alloy material at low temperatures over a period of time.

27. A method as in claim 26, wherein said thermal heater is adapted to anneal said doped layer of semiconductor alloy material at a temperature of 400°-500° Centigrade for 10-100 hours.

28. A method as in claim 23, including the further step of providing sufficient activation energy to also at least partially crystallize the body of semiconductor alloy material.

29. A method as in claim 1, wherein the doped polycrystalline semiconductor alloy material is employed in at least one element of a multi-element integrated circuit.

30. A method as in claim 29, wherein the multi-element integrated circuit comprises polycrystalline circuit elements on a glass substrate.

31. A method as in claim 30, wherein the glass substrate is a low temperature glass substrate.

32. A method as in claim 1, wherein the substrate is a perforated substrate, and comprising the step of depositing the doped layer of amorphous semoconductor alloy material in the perforations of the substrate to form semiconductor alloy vias therein; and subjecting said doped amorphous semiconductor alloy material to an activation energy sufficient to at least partially crystallize the doped semiconductor alloy vias thereof.

* * * * *